United States Patent
Yoo et al.

(10) Patent No.: US 10,136,537 B2
(45) Date of Patent: Nov. 20, 2018

(54) DISPLAY DEVICE AND METHOD OF MANUFACTURING THE SAME

(71) Applicant: Samsung Display Co., Ltd., Yongin-si, Gyeonggi-Do (KR)

(72) Inventors: Jae Suk Yoo, Seoul (KR); Seongsik Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 373 days.

(21) Appl. No.: 14/857,543

(22) Filed: Sep. 17, 2015

(65) Prior Publication Data
US 2016/0255739 A1 Sep. 1, 2016

(30) Foreign Application Priority Data
Feb. 27, 2015 (KR) .................. 10-2015-0028153

(51) Int. Cl.
*H05K 7/02* (2006.01)
*F21V 8/00* (2006.01)
(Continued)

(52) U.S. Cl.
CPC ............. *H05K 7/026* (2013.01); *G02B 6/005* (2013.01); *G02B 6/0045* (2013.01);
(Continued)

(58) Field of Classification Search
None
See application file for complete search history.

(56) References Cited

U.S. PATENT DOCUMENTS

| 8,979,294 B2 | 3/2015 | An et al. |
| 2008/0273137 A1 | 11/2008 | Jung et al. |

(Continued)

FOREIGN PATENT DOCUMENTS

| KR | 10-1211371 B1 | 3/2012 |
| KR | 10-2013-0055338 A | 5/2013 |

(Continued)

OTHER PUBLICATIONS

European Search Report issued by European Patent Office dated Jul. 25, 2016 in connection with European Patent Application No. 16150724.9, which also claims Korean Patent Application Serial No. 10-2015-0028153 as its priority document.

*Primary Examiner* — Elmito Breval
(74) *Attorney, Agent, or Firm* — H.C. Park & Associates, PLC

(57) ABSTRACT

A display device includes a backlight unit generating a light and curved, a display panel curved while being disposed on the backlight unit and receiving the light to display an image, and a heat discharge bottom chassis fixing the backlight unit and the display panel to each other and curved. The backlight unit includes a light source unit generating the light and an optical member disposed on the light source unit. The heat discharge bottom chassis includes a light source unit accommodating part accommodating the light source unit, an optical member accommodating part accommodating the optical member and supporting the display panel, and a display panel accommodating part disposed on the optical member accommodating part and accommodating the display panel. The light source unit accommodating part, the optical member accommodating part, and the display panel accommodating part include a same material.

15 Claims, 14 Drawing Sheets

(51) Int. Cl.
*G02F 1/1333* (2006.01)
*G02F 1/1335* (2006.01)

(52) U.S. Cl.
CPC ......... *G02B 6/0085* (2013.01); *G02B 6/0088* (2013.01); *G02F 1/133308* (2013.01); *G02F 2001/133314* (2013.01); *G02F 2001/133628* (2013.01); *G02F 2201/54* (2013.01)

(56) References Cited

U.S. PATENT DOCUMENTS

| | | | |
|---|---|---|---|
| 2012/0182492 A1 | 7/2012 | Ro et al. | |
| 2013/0180653 A1 | 7/2013 | Kim et al. | |
| 2013/0321740 A1* | 12/2013 | An | H05K 5/0217 |
| | | | 349/58 |
| 2014/0009914 A1 | 1/2014 | Cho et al. | |
| 2014/0111735 A1* | 4/2014 | Cho | G02F 1/133608 |
| | | | 349/58 |
| 2014/0168564 A1 | 6/2014 | Lee et al. | |
| 2014/0286000 A1 | 9/2014 | Cho et al. | |
| 2015/0042920 A1 | 2/2015 | Lee et al. | |

FOREIGN PATENT DOCUMENTS

| | | |
|---|---|---|
| KR | 10-2014-0007202 A | 1/2014 |
| KR | 10-2014-0017161 A | 2/2014 |
| KR | 10-2014-0036461 A | 3/2014 |

\* cited by examiner

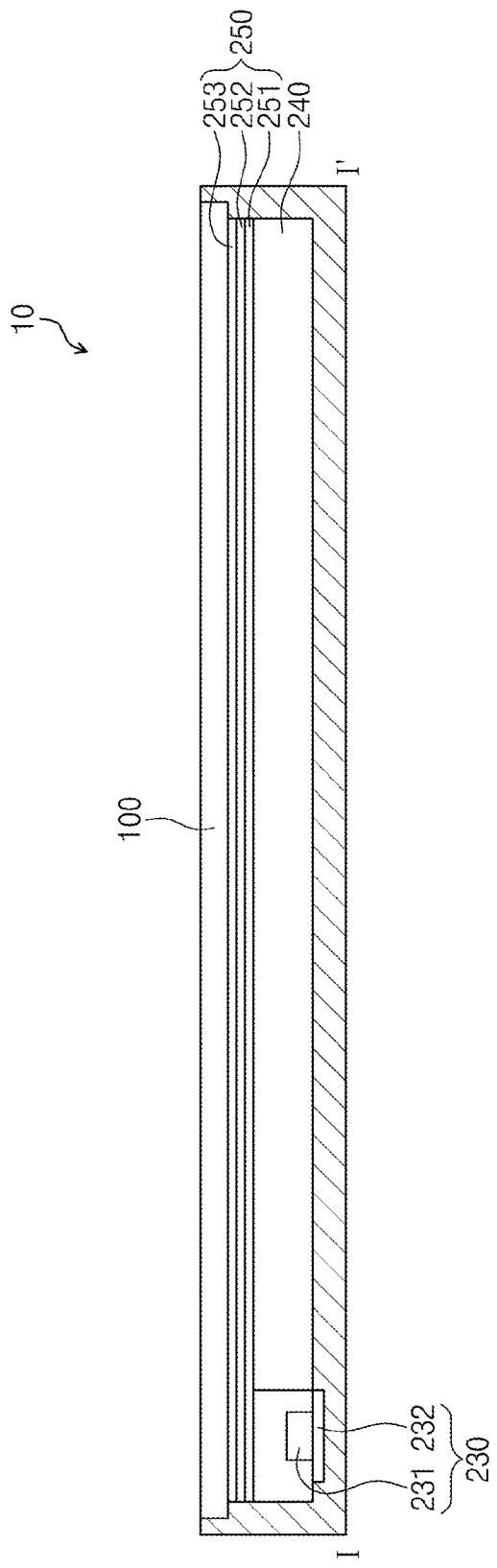

DISPLAY DEVICE AND METHOD OF MANUFACTURING THE SAME

CLAIM OF PRIORITY

This U.S. non-provisional patent application claims the priority of and all the benefits accruing under 35 U.S.C. § 119 of Korean Patent Application No. 10-2015-0028153, filed on Feb. 27, 2015 in the Korean Intellectual Property Office (KIPO), the contents of which are hereby incorporated by reference in its entirety.

BACKGROUND OF THE INVENTION

1. Field of Disclosure

The present disclosure relates to a display device and a method of manufacturing the same. More particularly, the present disclosure relates to a display device having a slim size and a method of manufacturing the display device.

2. Description of the Related Art

A flat panel display device is applied to various kinds of information processing devices, such as a television set, a monitor, a notebook computer, a mobile phone, etc., to display an image. In recent years, a curved surface display device with a curved shape has been developed. The curved surface display device provides a user with a display area having a curved display surface to increase three-dimensional effect, sense of immersion (or immersiveness), presence of the image.

SUMMARY OF THE INVENTION

The present disclosure provides a display device having a slim size and a method of manufacturing the display device.

Embodiments of the inventive concept provide a display device including a backlight unit, a display panel, and a heat discharge bottom chassis. The backlight unit generates a light and is curved. The display panel is curved while being disposed on the backlight unit and receives the light to display an image. The heat discharge bottom chassis fixes the backlight unit and the display panel to each other and is curved. The backlight unit includes a light source unit generating the light and an optical member disposed on the light source unit. The heat discharge bottom chassis includes a light source unit accommodating part accommodating the light source unit, an optical member accommodating part disposed on the light source unit accommodating part, accommodating the optical member, and supporting the display panel, and a display panel accommodating part disposed on the optical member accommodating part and accommodating the display panel. The light source unit accommodating part, the optical member accommodating part, and the display panel accommodating part comprise the same material.

The light source unit accommodating part, the optical member accommodating part, and the display panel accommodating part are integrally formed as a single unitary unit.

The light source unit accommodating part, the optical member accommodating part, and the display panel accommodating part are formed through the same process.

The light source unit accommodating part, the optical member accommodating part, and the display panel accommodating part are formed through a die-casting process.

The light source unit accommodating part, the optical member accommodating part, and the display panel accommodating part include a metal material or a metal alloy.

The display panel accommodating part includes a display panel accommodating hole to accommodate the display panel. The optical member accommodating part includes an optical member accommodating hole to accommodate the optical member. The light source unit accommodating part includes a light source unit accommodating groove to accommodate the light source unit.

The optical member accommodating hole has a size greater than a size of the display panel accommodating hole.

The optical member accommodating part includes first accommodating sidewalls. The display panel accommodating part includes second accommodating sidewalls, and a width of at least one of the first accommodating sidewalls is smaller than a width of at least one of the second accommodating sidewalls.

At least one of the first accommodating sidewalls supports the display panel.

The first accommodating sidewalls include a first sub-accommodating sidewall, a second sub-accommodating sidewall spaced apart from the first sub-accommodating sidewall, a third sub-accommodating sidewall connected to the first and second sub-accommodating sidewalls, and a fourth sub-accommodating sidewall spaced apart from the third sub-accommodating sidewall. The second accommodating sidewalls include a fifth sub-accommodating sidewall, a sixth sub-accommodating sidewall spaced apart from the fifth sub-accommodating sidewall, a seventh sub-accommodating sidewall connected to the fifth and sixth sub-accommodating sidewalls, and an eighth sub-accommodating sidewall spaced apart from the seventh sub-accommodating sidewall. A distance between the fifth sub-accommodating sidewall and the sixth sub-accommodating sidewall is greater than a distance between the first sub-accommodating sidewall and the second sub-accommodating sidewall.

The display device further includes a printed circuit board electrically connected to the display panel and a tape carrier package connected to the display panel and the printed circuit board.

The display device further includes a top chassis covering at least one side surface of side surfaces of the display panel.

The printed circuit board is disposed under the heat discharge bottom chassis and the top chassis covers the printed circuit board and the tape carrier package.

The heat discharge bottom chassis further includes a bracket disposed under the light source unit accommodating part to reinforce strength of the heat discharge bottom chassis, and the bracket includes the light source unit accommodating part, the optical member accommodating part, and the display panel accommodating part.

The display panel has a first radius of curvature, the backlight unit has a second radius of curvature greater than the first radius of curvature, and the heat discharge bottom chassis has a third radius of curvature greater than the first and second radius of curvatures.

Embodiments of the inventive concept provide a method of manufacturing a display device, including manufacturing a head discharge bottom chassis using a die-casting process, providing a backlight unit to the heat discharge bottom chassis, and providing a display panel on the backlight unit. Each of the display panel, the backlight unit, and the heat discharge bottom chassis is curved.

The providing of the backlight unit includes providing a light source unit and providing an optical member on the light source unit. The bottom chassis is manufactured to include a light source unit accommodating part accommodating the light source unit, an optical member accommodating part disposed on the light source unit accommodating part, accommodating the optical member, and supporting the display panel, and a display panel accommodating part accommodating the display panel.

The heat discharge bottom chassis is manufactured using a metal material or a metal alloy.

Embodiments of the inventive concept provide a display device including a backlight unit generating a light and being curved and a display panel curved while being disposed on the backlight unit and receiving the light to display an image, and a heat discharge bottom chassis fixing the backlight unit and the display panel to each other and being curved. The heat discharge bottom chassis is manufactured by a die-casting process.

The display device further includes a top cover covering one side surface of side surfaces of the display panel without covering other side surfaces.

According to the above, the display device may be slimmed down.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 1B is a cross-sectional view taken along a line I-I' of FIG. 1A;

DETAILED DESCRIPTION OF THE INVENTION

Figure 1A:
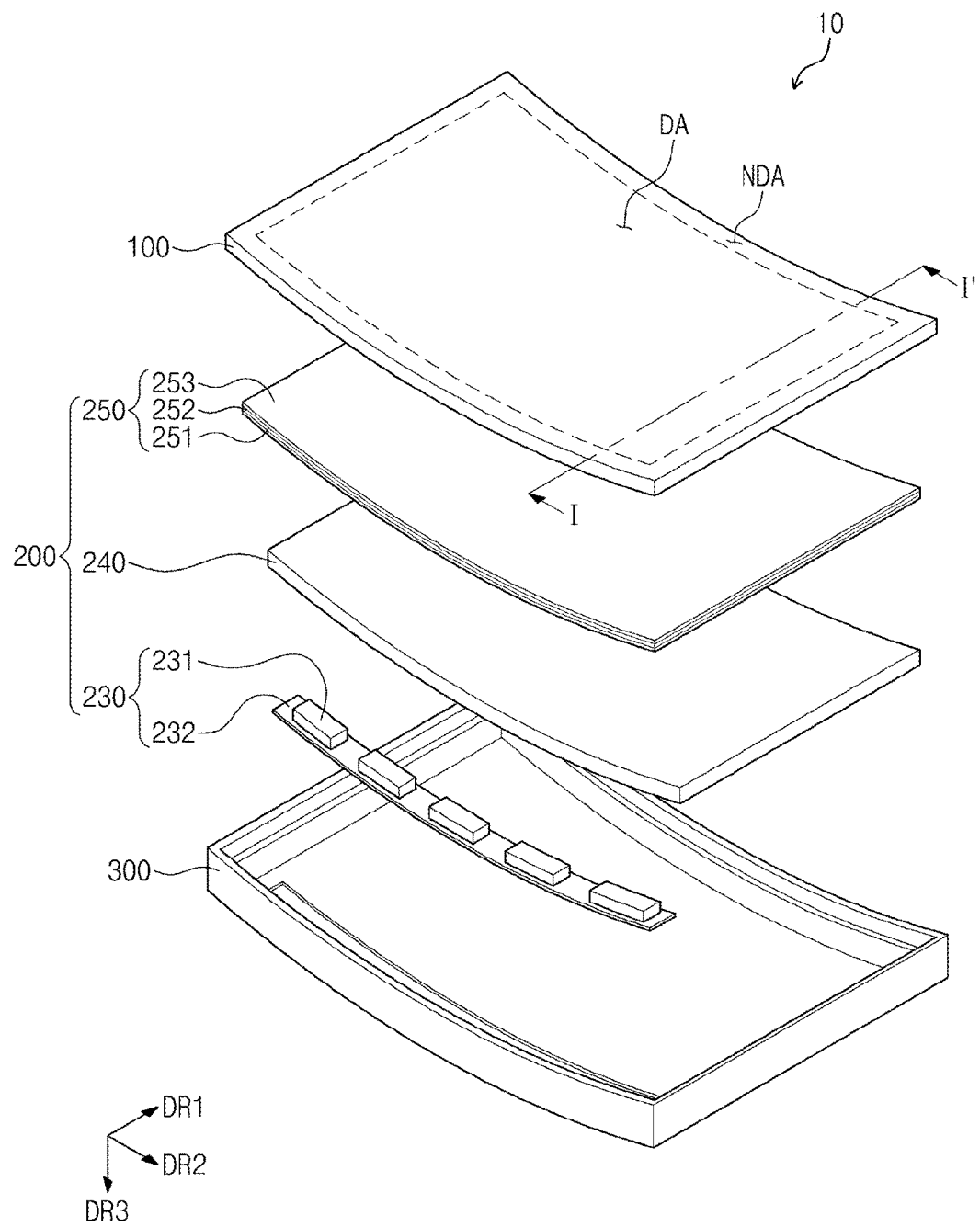
FIG. 1A is an exploded perspective view showing a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1A is an exploded perspective view showing a display device 10 according to an exemplary embodiment of the present disclosure and FIG. 1B is a cross-sectional view taken along a line I-I' of FIG. 1A.

Referring to FIGS. 1A and 1B, the display device 10 includes a backlight unit 200, a display panel 100, and a heat discharge bottom chassis 300.

The display panel 100 is disposed on the backlight unit 200. The display panel 100 receives a light and displays an image. The display panel 100 is not a self-emissive display panel, e.g., a liquid crystal display panel, a plasma display panel, an electrophoretic display panel, a microelectromechanical system display pane, an electrowetting display panel, etc. In the present exemplary embodiment, the liquid crystal display panel will be described as the display panel 100.

The liquid crystal display panel is a vertical alignment (VA) mode, patterned vertical alignment (PVA) mode, in-plane switching (IPS) mode, fringe-field switching (FFS) mode, or plane-to-line switching (PLS) mode display panel.

The display panel 100 includes a display area DA in which the image is displayed and a non-display area NDA in which the image is not displayed. The display area DA displays the image. When viewed in a thickness direction DR3 of the display device 10, the display device DA has substantially a rectangular shape, but it should not be limited thereto or thereby.

The display area DA includes a plurality of pixel areas (not shown). The pixel areas (not shown) are arranged in a matrix form. The pixel areas (not shown) include a plurality of pixels (not shown), respectively.

The non-display area NDA does not display the image. The non-display area NDA surrounds the display area DA when viewed in the thickness direction DR3 of the display device 10. The non-display area NDA is disposed adjacent to the display area DA in a first direction DR1 and a second direction DR2 substantially vertical to the first direction DR1.

Figure 2A:
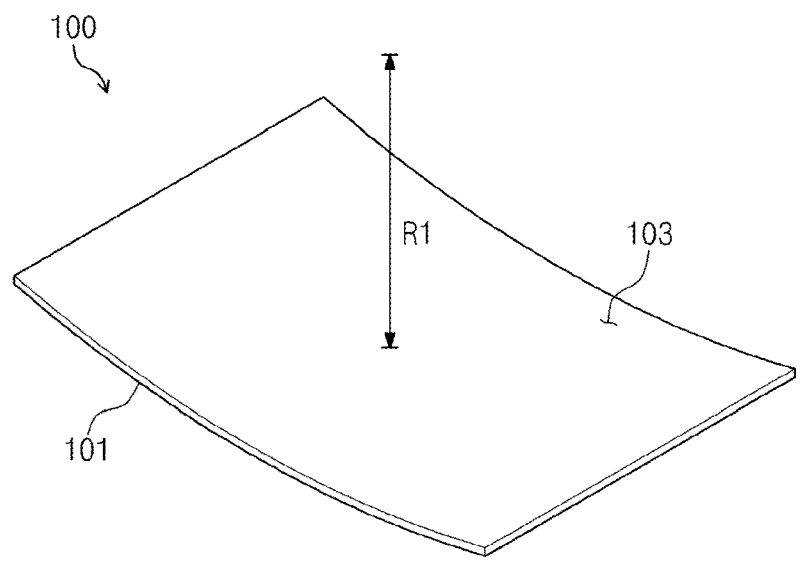
FIG. 2A is a perspective view showing a display panel included in a display device according to an exemplary embodiment of the present disclosure.

FIG. 2A is a perspective view showing a display panel included in a display device according to an exemplary embodiment of the present disclosure.

Referring to FIGS. 1A, 1B, and 2A, the display panel 100 is curved. FIG. 2A shows that the display panel 100 has a first radius of curvature R1. For instance, a display curved surface 103 included in the display panel 100 has the first radius of curvature R1. However, in a case that the display panel 100 is convex-curved when viewed from a rear surface 101 of the display curved surface 103, the rear surface 101 has the first radius of curvature R1.

The first radius of curvature R1 is within a range from about 2000 mm to about 5000 mm. When the first radius of curvature R1 is smaller than about 2000 mm, a user is difficult to effectively recognize the image displayed on the display device 10, and when the first radius of curvature R1 is greater than about 5000 mm, three-dimensional effect, sense of immersion (or immersiveness), and presence of the image displayed on the display device 10 are deteriorated.

In FIGS. 1A and 2A, the display panel 100 has a concave shape when viewed from the upper surface 103 in the thickness direction DR3 of the display device 10, but it should not be limited thereto or thereby. That is, the display panel 100 may have a convex shape when viewed from the rear surface 101 in the thickness direction DR3 of the display device 10.

Figure 2B:
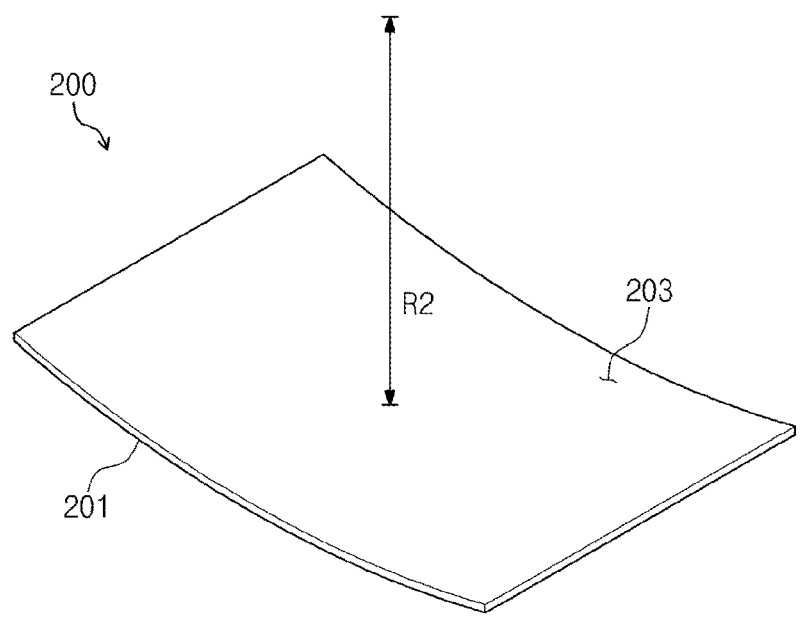
FIG. 2B is a perspective view showing a backlight unit included in a display device according to an exemplary embodiment of the present disclosure.

FIG. 2B is a perspective view showing a backlight unit 200 included in a display device according to an exemplary embodiment of the present disclosure.

Referring to FIGS. 1A, 1B, 2A, and 2B, the backlight unit 200 provides the display panel 100 with the light. The backlight unit 200 is curved. FIG. 2B shows that the backlight unit 200 has a second radius of curvature R2. For instance, an upper surface 203 included in the backlight unit 200 has the second radius of curvature R2. The second radius of curvature R2 is greater than the first radius of curvature R1. However, in a case that the backlight unit 200 is convex-curved when viewed from the upper surface 203 to a lower surface 201 and the lower surface 201 has the second radius of curvature R2. In this case, the second radius of curvature R2 may be smaller than the first radius of curvature R1.

The backlight unit 200 includes a light source unit 230 generating the light and an optical member 250 disposed on the light source unit 230. The backlight unit 200 may further include a light guide plate.

The light source unit 230 has a curved shape. The light source unit 230 includes at least one light source 231 and a circuit board 232 applying a source voltage to the light source 231. The light source 231 is mounted on the circuit board 232. The light source 231 may be, but not limited to, a light emitting diode. The light source 231 is provided in a plural numbers and the light sources 231 are arranged on the circuit board 232 and spaced apart from each other in the second direction DR2. Each of the light source 231 and the circuit board 232 has a curved shape.

The light guide plate 240 has a curved shape. The light guide plate 240 guides the light provided from the light source unit 230. The light guide plate 240 has substantially a rectangular plate shape when viewed in the thickness direction DR3 of the display panel 100. The light guide plate 240 is disposed under the display panel 100. The light guide plate 240 includes a transparent polymer resin, such as polycarbonate, polymethyl methacrylate, etc. The light guide plate 230 guides the light provided from the light source unit 230 to the display panel 100. The light incident to the light guide plate 240 exits through an upper surface of the light guide plate 240 and travels toward the display panel 100.

In the present exemplary embodiment, the light source unit 230 is disposed at a position corresponding to one side surface of the light guide plate 240, but it should not be limited thereto or thereby. That is, the light source unit 230 may be provided in a plural number and the light source units 230 are disposed to side surfaces of the light guide plate 240. In the present exemplary embodiment, the light source unit 230 of the display device 10 is an edge-illumination type light source unit 230, however the display device 10 may include a direct-illumination type light source unit 230.

The optical member 250 has a curved shape. The optical member 250 is disposed between the display panel 100 and the light guide plate 240. The optical member 250 improves brightness of the light exiting from an exit surface of the light guide plate 240 and a viewing angle. The optical member 250 includes a first optical sheet 251, a second optical sheet 252, and a third optical sheet 253, which are sequentially stacked one on another. Each of the first, second, and third sheets 251, 252, and 253 has a curved shape.

The first optical sheet 251 may be a diffusion sheet to diffuse the light exiting from the light guide plate 240. The second optical sheet 252 may be a prism sheet to condense the light diffused by the diffusion sheet in a direction substantially vertical to a plane surface of the display panel 100. The third optical sheet 253 may be a protective sheet to protect the prism sheet from external sheets. In the present exemplary embodiment, at least one of the first, second, and third sheets 251, 252, and 253 may be provided in plural number, or one or more of the first, second, and third optical sheets 251, 252, and 253 may be omitted from the optical sheet 250.

Although not shown in figures, the backlight unit 200 may further include a reflective sheet that is curved. The reflective sheet is disposed under the light guide plate 240. The reflective sheet reflects light leaked downward from the display panel 100 without being directed to the display panel 100, and thus the reflected light by the reflective sheet travels to the display panel 100. Accordingly, the reflective sheet increases an amount of the light traveling to the display panel 100.

Figure 2C:
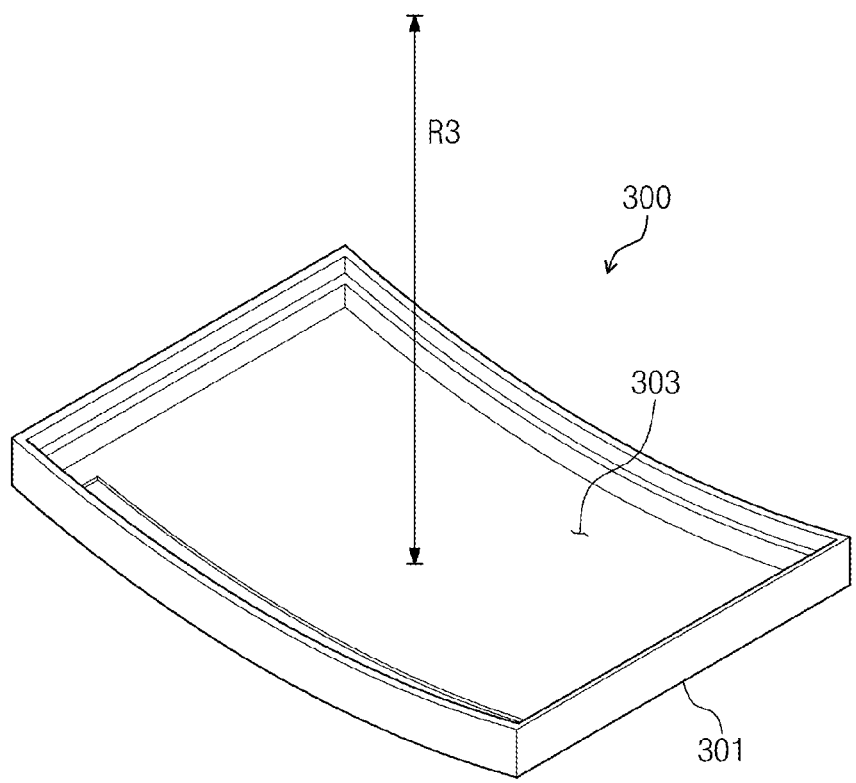
FIG. 2C is a perspective view showing a heat discharge bottom chassis included in a display device according to an exemplary embodiment of the present disclosure.

FIG. 2C is a perspective view showing the heat discharge bottom chassis 300 included in a display device according to an exemplary embodiment of the present disclosure.

Referring to FIGS. 1A, 1B, and 2A to 2C, the heat discharge bottom chassis 300 fixes the display panel 100 and the backlight unit 200 to each other. The heat discharge bottom chassis 300 has a curved shape at a third radius of curvature R3. For instance, a bottom upper surface 303 of the heat discharge bottom chassis 300 has the third radius of curvature R3. The third radius of curvature R3 is greater than each of the first and second radius of curvatures R1 and R2. However, in a case that the heat discharge bottom chassis 300 is convex-curved when viewed from the bottom upper surface 303 to a bottom lower surface 301, the bottom lower surface 301 has the third radius of curvature R3. In this case, the third radius of curvature R3 is smaller than each of the first and second radius of curvatures R1 and R2

Figure 3A:
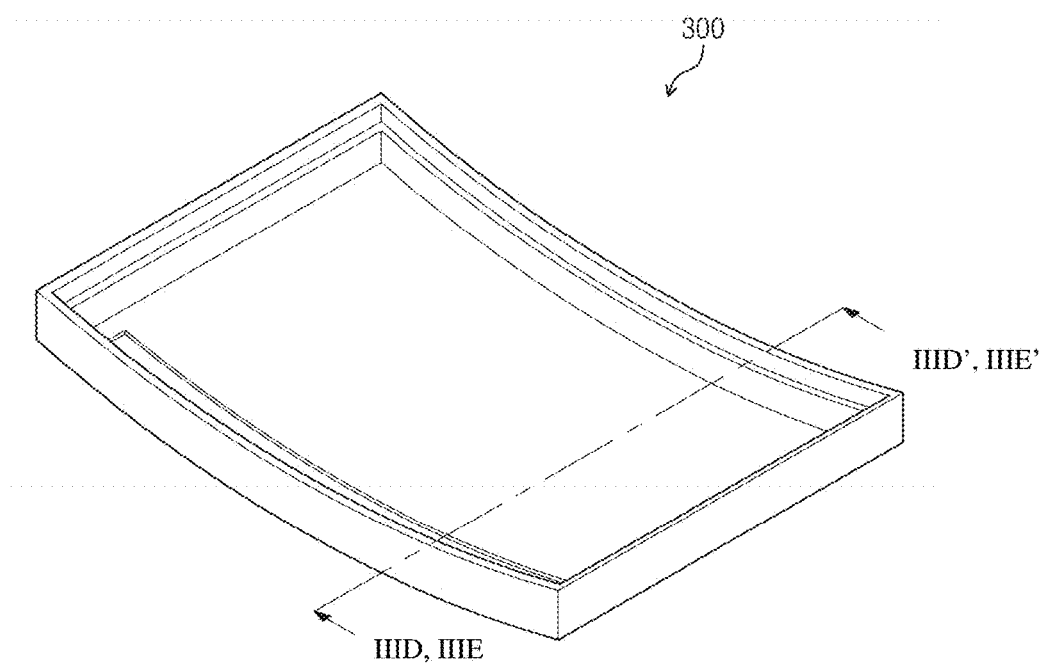
FIG. 3A is a perspective view showing a heat discharge bottom chassis included in a display device according to an exemplary embodiment of the present disclosure.
Figure 3B:
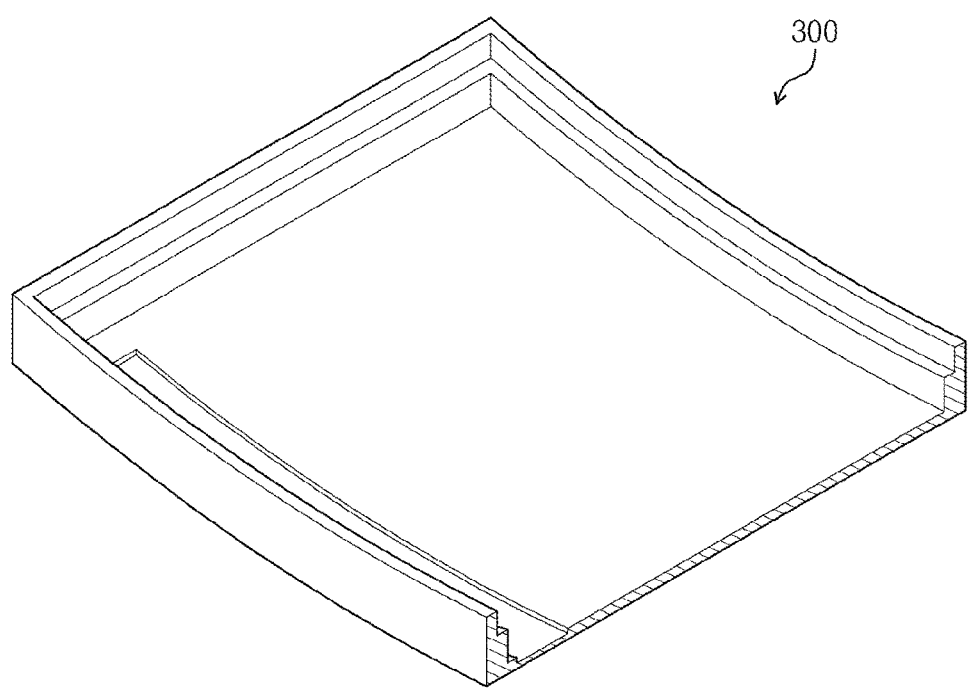
FIG. 3B is a perspective view showing a portion of the heat discharge bottom chassis shown in FIG. 3A.
Figure 3C:
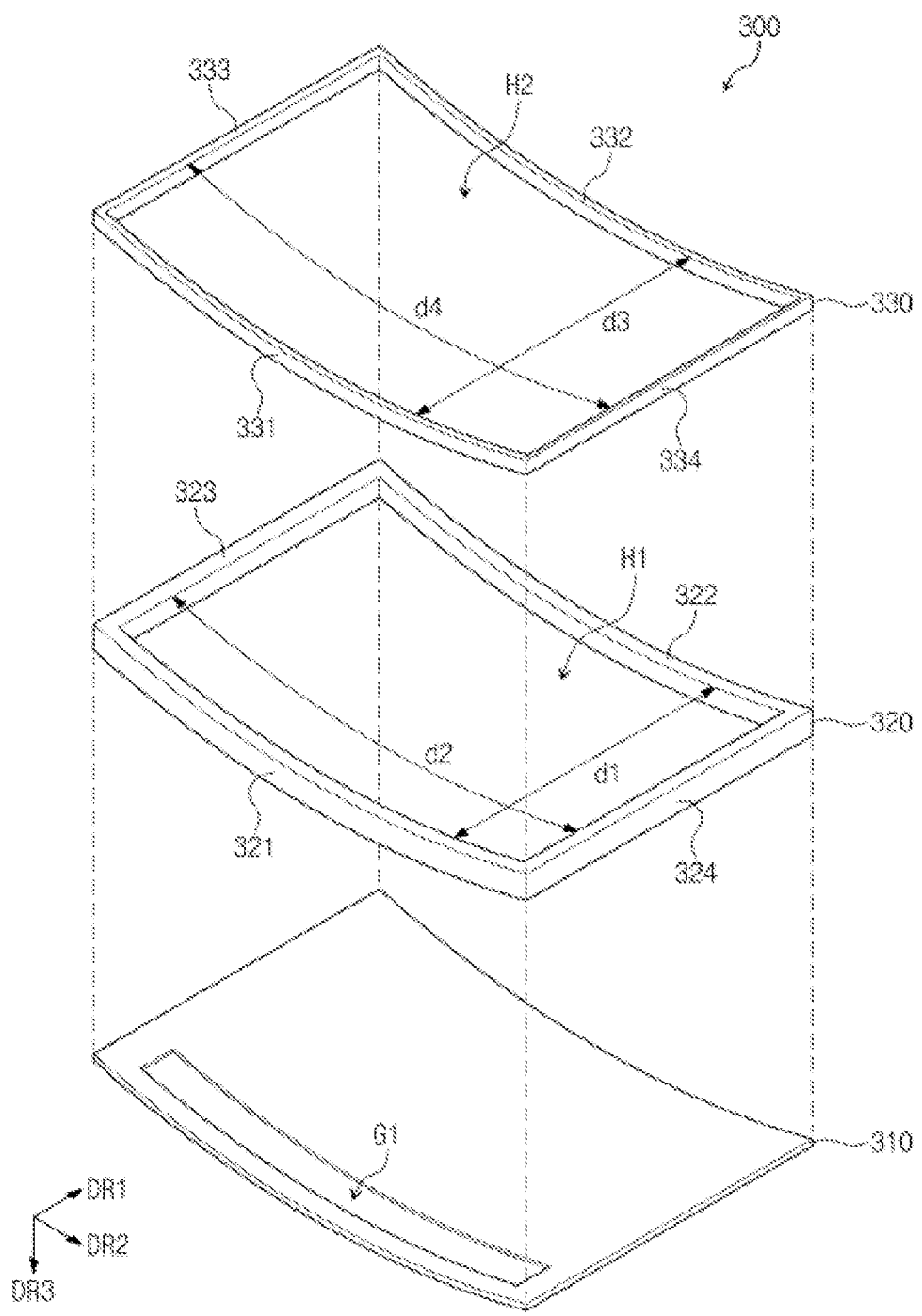
FIG. 3C is an exploded perspective view showing a bottom chassis included in a display device according to an exemplary embodiment of the present disclosure.
Figure 3D:
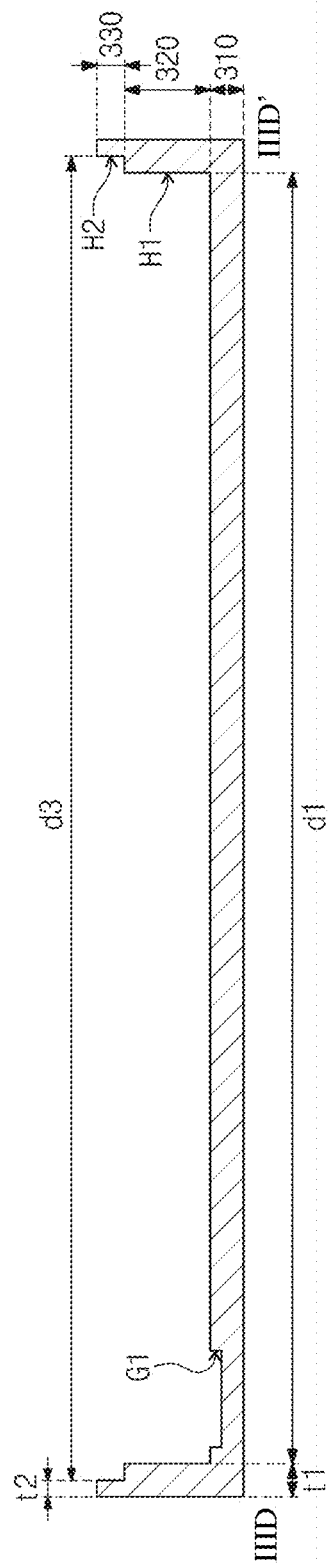
FIG. 3D is a cross-sectional view taken along a line IIID-IIID' of FIG. 3A.
Figure 3E:
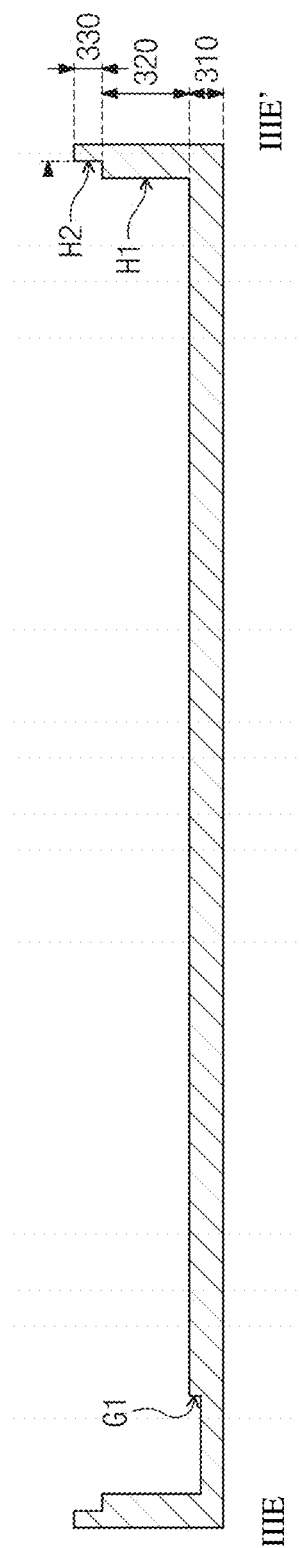
FIG. 3E is a cross-sectional view of another embodiment taken along a line IIIE-IIIE' of FIG. 3A.

FIG. 3A is a perspective view showing a heat discharge bottom chassis included in a display device according to an exemplary embodiment of the present disclosure, FIG. 3B is a perspective view showing a portion of the heat discharge bottom chassis shown in FIG. 3A, FIG. 3C is an exploded perspective view showing a bottom chassis included in a display device according to an exemplary embodiment of the present disclosure, FIG. 3D is a cross-sectional view taken along a line IIID-IIID' of FIG. 3A, and FIG. 3E is a cross-sectional view of another embodiment taken along a line IIIE-IIIE' of FIG. 3A.

Referring to FIGS. 1A, 1B, and 3A to 3E, the heat discharge bottom chassis 300 includes a light source unit accommodating part 310, an optical member accommodating part 320, and a display panel accommodating part 330. The light source unit accommodating part 310, the optical member accommodating part 320, and the display panel accommodating part 330 may have the same material. The light source unit accommodating part 310, the optical member accommodating part 320, and the display panel accommodating part 330 include a metal material or a metal alloy. For instance, the light source unit accommodating part 310, the optical member accommodating part 320, and the display panel accommodating part 330 include aluminum, gold, silver, iron, etc.

The light source unit accommodating part 310, the optical member accommodating part 320, and the display panel accommodating part 330 may be integrally formed as a single unitary unit. The light source unit accommodating part 310, the optical member accommodating part 320, and the display panel accommodating part 330 include may be manufactured by the same process. In more detail, the light source unit accommodating part 310, the optical member accommodating part 320, and the display panel accommodating part 330 are manufactured by a die-casting process.

The light source unit accommodating part 310 accommodates the light source unit 230.

The light source unit accommodating part 310 is connected with the optical member accommodating part 320. The light source unit accommodating part 310 is provided with a light source unit accommodating groove G1 formed therein to accommodate the light source unit 230. FIG. 1B shows the circuit board 232 accommodated in the light source unit accommodating groove G1, but a portion of the light source 231 may be accommodated in the light source unit accommodating groove G1.

The optical member accommodating part 320 is disposed on the light source unit accommodating part 310. The optical member accommodating part 320 is disposed between the light source unit accommodating part 310 and the display panel accommodating part 330. The optical member accommodating part 320 is connected to the display panel accommodating part 330. The optical member accommodating part 320 accommodates the optical member 250 therein and supports the display panel 100. The optical member accommodating part 320 is provided with an optical member accommodating hole H1 formed therethrough to accommodate the optical member 250. The optical member accommodating part 320 accommodates the light guide plate 240.

The display panel accommodating part 330 is disposed on the optical member accommodating part 320 and accommodates the display panel 100. The display panel accommodating part 330 is connected to the optical member accommodating part 320. The display panel accommodating part 330 is provided with a display panel accommodating hole H2 formed therethrough to accommodate the display panel 100. The display panel accommodating hole H2 is greater than the optical member accommodating hole H1.

The optical member accommodating part 320 includes first accommodating sidewalls 321, 322, 323, and 324. At least one of the first accommodating sidewalls 321, 322, 323, and 324 supports the display panel 100.

Each of the first accommodating sidewalls 321, 322, 323, and 324 has a first width t1. FIGS. 3A to 3E show the first accommodating sidewalls 321, 322, 323, and 324 having the same width, but they should not be limited thereto or thereby. That is, the width of at least one of the first accommodating sidewalls 321, 322, 323, and 324 may be different from others. The width of at least one of the first accommodating sidewalls 321, 322, 323, and 324 may be greater than a width of at least one of second accommodating sidewalls 331, 332, 333, and 334.

The first accommodating sidewalls 321, 322, 323, and 324 include a first sub-accommodating sidewall 321, a second sub-accommodating sidewall 322, a third sub-accommodating sidewall 323, and a fourth sub-accommodating sidewall 324. The second sub-accommodating sidewall 322 is spaced apart from the first sub-accommodating sidewall 321 in the first direction DR1. The third sub-accommodating sidewall 323 is connected to the first sub-accommodating sidewall 321 and the second sub-accommodating sidewall 322. The fourth sub-accommodating sidewall 324 is spaced apart from the third sub-accommodating sidewall 323 in the second direction DR2. The fourth sub-accommodating sidewall 324 is connected to the first sub-accommodating sidewall 321 and the second sub-accommodating sidewall 322.

The first sub-accommodating sidewall 321 and the second sub-accommodating sidewall 322 are spaced apart from each other by a first distance d1. The third sub-accommodating sidewall 323 and the fourth sub-accommodating sidewall 324 are spaced apart from each other by a second distance d2. In FIG. 3A, the second distance d2 is greater than the first distance d1, but the first distance d1 may be greater than the second distance d2 according to embodiments.

The display panel accommodating part 330 includes the second accommodating sidewalls 331, 332, 333, and 334. Upper surfaces of the second accommodating sidewalls 331, 332, 333, and 334 are exposed to the outside. In FIG. 1B, the upper surfaces of the second accommodating sidewalls 331, 332, 333, and 334 are disposed on the same straight line as the upper surface of the display panel 100, but they should not be limited thereto or thereby. According to embodiments, the upper surfaces of the second accommodating sidewalls 331, 332, 333, and 334 may not be disposed on the same straight line as the upper surface of the display panel 100.

Each of the second accommodating sidewalls 331, 332, 333, and 334 has a second width t2. FIGS. 3A to 3E show the second accommodating sidewalls 331, 332, 333, and 334 having the same width, but they should not be limited thereto or thereby. That is, the width of at least one of the second accommodating sidewalls 331, 332, 333, and 334 may be different from others. The width of at least one of the second accommodating sidewalls 331, 332, 333, and 334 may be greater than the width of at least one of second accommodating sidewalls 331, 332, 333, and 334.

The second accommodating sidewalls 331, 332, 333, and 334 include a fifth sub-accommodating sidewall 331, a sixth sub-accommodating sidewall 332, a seventh sub-accommodating sidewall 333, and an eighth sub-accommodating sidewall 334. The sixth sub-accommodating sidewall 332 is spaced apart from the fifth sub-accommodating sidewall 331 in the first direction DR1. The seventh sub-accommodating sidewall 333 is connected to the fifth sub-accommodating sidewall 331 and the sixth sub-accommodating sidewall 332. The eighth sub-accommodating sidewall 334 is spaced apart from the seventh sub-accommodating sidewall 333 in the second direction DR2. The eighth sub-accommodating sidewall 334 is connected to the fifth sub-accommodating sidewall 331 and the sixth sub-accommodating sidewall 332.

The fifth sub-accommodating sidewall 331 and the sixth sub-accommodating sidewall 332 are spaced apart from each other by a third distance d3. The seventh sub-accommodating sidewall 333 and the eighth sub-accommodating sidewall 334 are spaced apart from each other by a fourth distance d4. In FIG. 3A, the fourth distance d4 is greater than the third distanced 3, but the third distance d3 may be greater than the fourth distance d4 according to embodiments.

The third distance d3 is greater than the first distance d1 and the fourth distance d4 is greater than the second distance d2, but they should not be limited thereto or thereby. That is, the third distance d3 may substantially the same as the first distance d1 and the fourth distance d4 may substantially the same as the second distance d2.

The light source unit accommodating part 310, the optical member accommodating part 320, and the display panel accommodating part 330 may be disposed in various forms. As shown in FIG. 3D, the light source unit accommodating groove G1 is spaced apart from the second accommodating sidewalls 331, 332, 333, and 334. As shown in FIG. 3E, the light source unit accommodating groove G1 is connected to the second accommodating sidewalls 331, 332, 333, and 334.

In FIGS. 3A to 3E, the light source unit accommodating groove G1 is disposed adjacent to the first sub-accommodating sidewall 321, but the light source unit accommodating groove G1 may be disposed adjacent to the second sub-accommodating sidewall 322, the third sub-accommodating sidewall 323, or the fourth sub-accommodating sidewall 324.

Figure 4A:
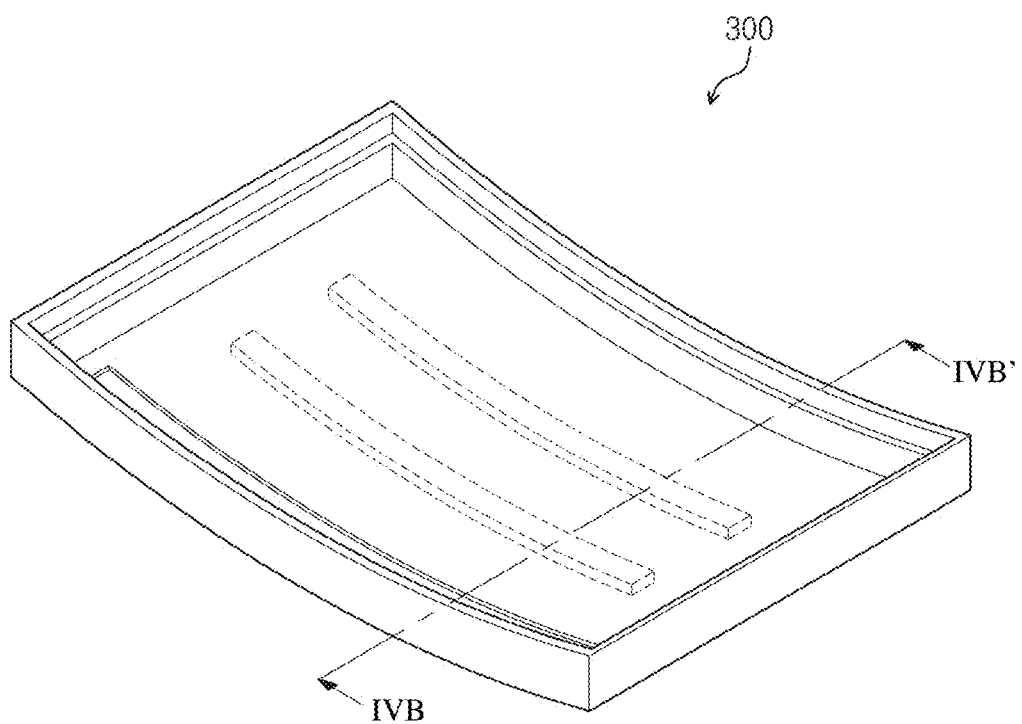
FIG. 4A is a perspective view showing a heat discharge bottom chassis included in a display device according to an exemplary embodiment of the present disclosure.
Figure 4B:
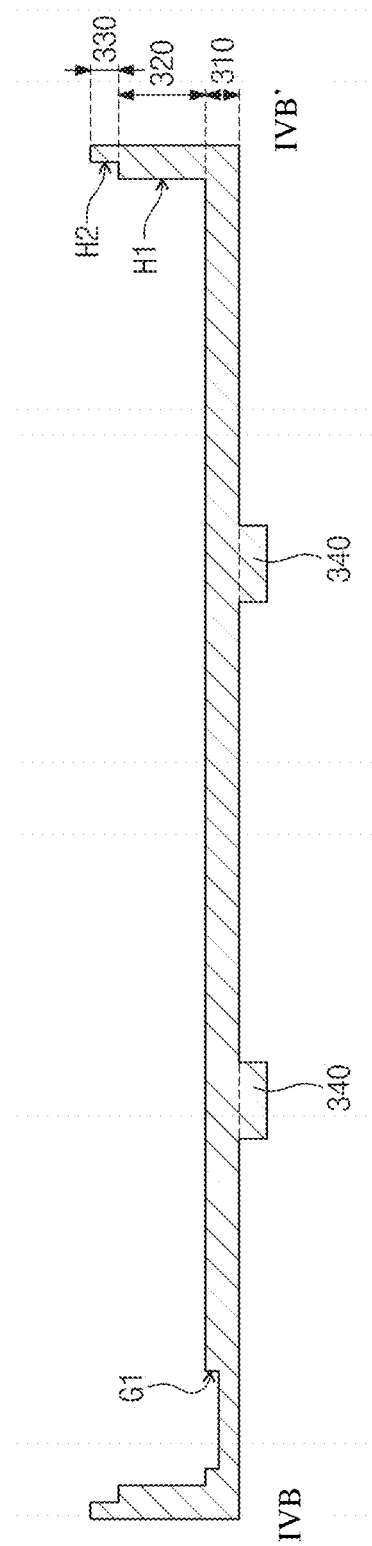
FIG. 4B is a cross-sectional view taken along a line IVB-IVB' of FIG. 4A.

FIG. 4A is a perspective view showing a heat discharge bottom chassis included in a display device according to an exemplary embodiment of the present disclosure and FIG. 4B is a cross-sectional view taken along a line IVB-IVB' of FIG. 4A.

Referring to FIGS. 1A, 1B, 4A, and 4B, the head discharge bottom chassis 300 further includes a bracket 340 disposed under the light source unit accommodating part 310 to reinforce a strength of the heat discharge bottom chassis 300. The bracket 340 includes the same material as the light source unit accommodating part 310, the optical member accommodating part 320, and the display panel accommodating part 330.

The bracket 340 is connected to the light source unit accommodating part 310. FIGS. 4A and 4B show two brackets 340, but the number of the brackets 340 should not be limited to two. That is, the number of the bracket 340 may be one, or three, or more.

In FIGS. 4A and 4B, the bracket 340 extends in the second direction DR2, however the bracket 340 may extend in the first direction DR1 according to embodiments.

Figure 5A:
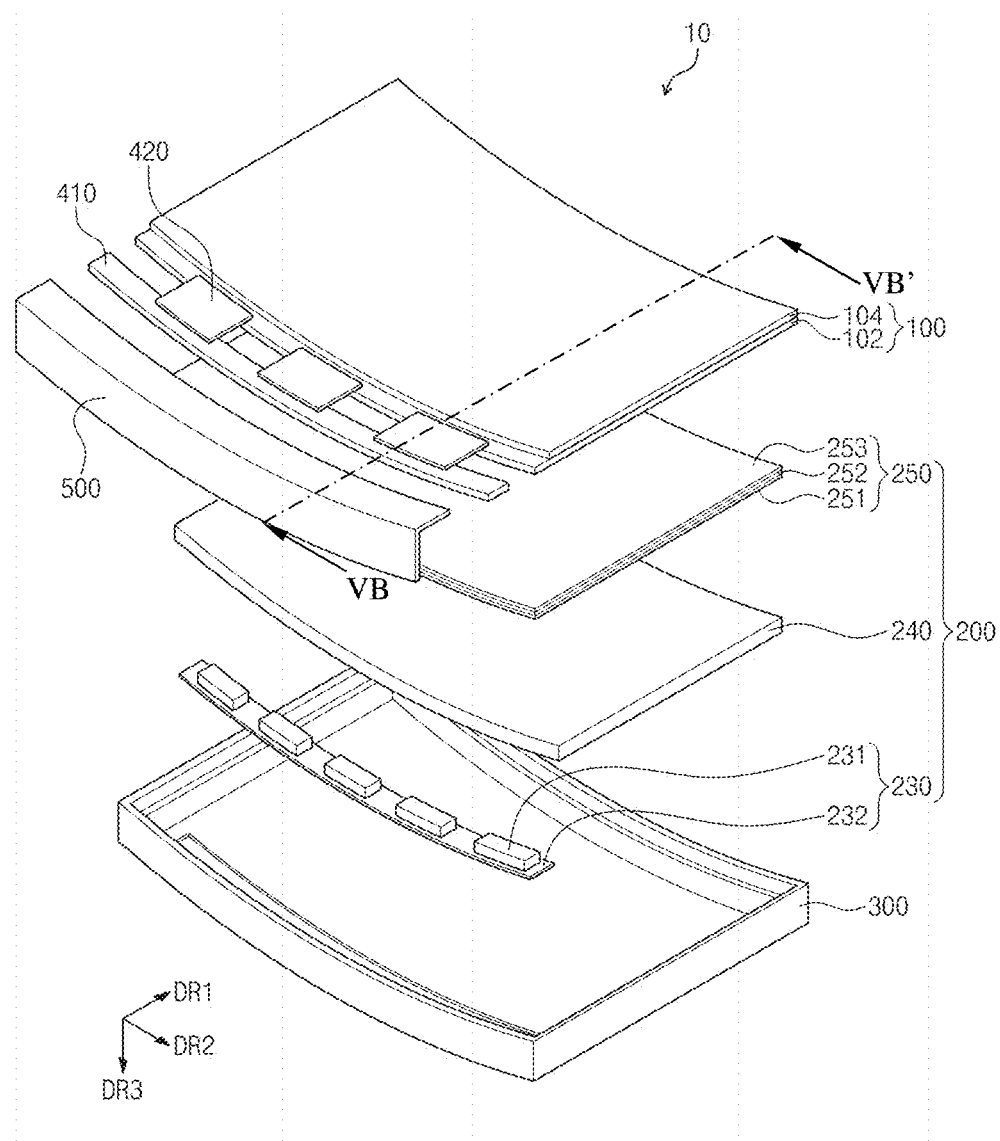
FIG. 5A is an exploded perspective view showing a display device according to an exemplary embodiment of the present disclosure.
Figure 5B:
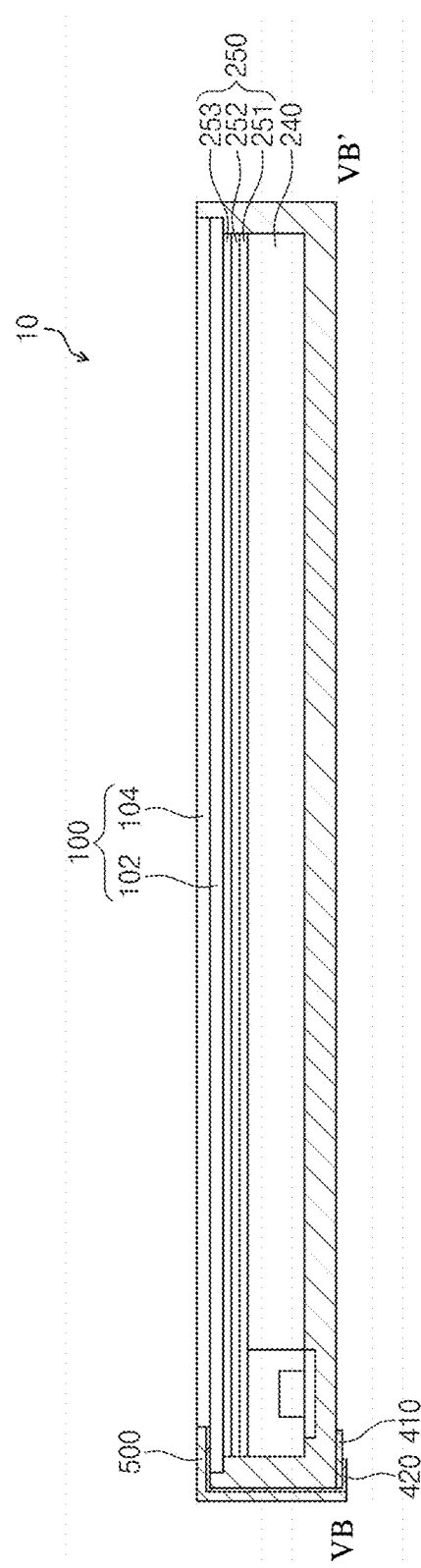
FIG. 5B is a cross-sectional view taken along a line VB-VB' of FIG. 5A.

FIG. 5A is an exploded perspective view showing a display device 10 according to an exemplary embodiment of the present disclosure and FIG. 5B is a cross-sectional view taken along a line VB-VB' of FIG. 5A.

Referring to FIGS. 5A and 5B, the display device 10 includes a display panel 100, a backlight unit 200, a heat discharge bottom chassis 300, a printed circuit board 410, a tape carrier package 420, and a top chassis 500. Hereinafter, different features of the display device 10 shown in FIGS. 5A and 5B from those of the display device 10 shown in FIGS. 1A and 1B will be described in detail.

The display panel 100 displays the image. The display panel 100 includes a first substrate 102 and a second substrate 104 facing the first substrate 102. Although not shown in figures, the display panel 100 includes a liquid crystal layer interposed between the first and second substrates 102 and 104.

Although not shown in figures, the first substrate 102 includes a plurality of gate lines extending in a first direction DR1 and a plurality of data lines extending in a second direction DR2 substantially vertical to the first direction DR1. The data lines are insulated from the gate lines while crossing the gate lines. The first substrate 102 includes a plurality of pixel areas arranged in a matrix form. Each pixel area includes a thin film transistor and a pixel electrode. The thin film transistor includes a gate electrode electrically connected to a corresponding gate line of the gate lines, a source electrode electrically connected to a corresponding data line of the data lines, and a drain electrode electrically connected to a pixel electrode. Accordingly, the thin film transistor switches a signal to the pixel electrode to control or drive the pixel areas.

Although not shown in figures, the second substrate 104 includes a color filter realizing a predetermined color using a light and a common electrode disposed on the color filter to face the pixel electrode. According to embodiments, the color filter and the common electrode may be disposed on the first substrate 102.

The liquid crystal layer (not shown) is interposed between the first and second substrates 102 and 104. The liquid crystal layer includes liquid crystal molecules aligned in a specific direction in accordance with an electric field caused by voltages respectively applied to the pixel electrode and the common electrode to control a transmittance of the light provided from the backlight unit 200 and passing through the liquid crystal layer, thereby displaying a desired image.

The display device 10 includes the printed circuit board 410 electrically connected to the display panel 100 and the tape carrier package 420 connected to the display panel 100 and the printed circuit board 410. The display device 10 includes the top chassis 500 to cover at least one side surface of side surfaces of the display panel 100.

The printed circuit board 410 is electrically connected to the display panel 100. The printed circuit board 410 is attached to the lower portion of the heat discharge bottom chassis 300. The printed circuit board 410 has a curved shape.

The printed circuit board 410 drives the display panel 100. The printed circuit board 410 includes a driver (not shown) to apply a driving signal to the printed circuit board 410, but it should not be limited thereto or thereby. That is, the driver (not shown) may be included in the tape carrier package 420.

The driver (not shown) generates a driving signal in response to an external signal to drive the display panel 100. The external signal is provided from the printed circuit board 410 and includes an image signal, various control signals, a driving voltage, etc.

To display the image through the display panel 100, a gate signal and a data signal are required, and the driver (not shown) includes a data driver that converts the image signal to a data signal and applies the data signal to the display panel 100. The data driver (not shown) may be mounted on the tape carrier package 420 in a chip form or mounted on the first substrate 102 through a chip-on-glass scheme.

A gate driver (not shown) generating the gate signal is directly formed on the first substrate 102, but it should not be limited thereto or thereby. For instance, the gate driver (not shown) may be mounted on the tape carrier package 420 or the driver (not shown) in a chip form.

The printed circuit board 410 may be flexible or rigid. For instance, the printed circuit board 410 may be a polymer substrate, a plastic substrate, a glass substrate, or a quartz substrate.

The tape carrier package 420 electrically connects the printed circuit board 410 and the display panel 100. The tape carrier package 420 has a film shape with elasticity. The tape carrier package 420 may be provided in a plural number.

The top chassis 500 covers the printed circuit board 410 and the tape carrier package 420. The top chassis 500 has a curved shape. The top chassis 500 is provided on at least one side surface of the heat discharge bottom chassis 300. For instance, the top chassis 500 is provided on the one side surface of the heat discharge bottom chassis 300 without being disposed on other side surfaces.

The top chassis 500 includes the same material as that of the heat discharge bottom chassis 300. For instance, the top chassis 500 includes a metal material or a metal alloy. For instance, the top chassis 500 includes aluminum, gold, silver, iron, etc.

A conventional display device includes a set structure coupled to an outer surface of the display device, and thus it is difficult to slim the display device. However, the display device 10 according to the present exemplary embodiment includes the heat discharge bottom chassis 300 obtained by integrally forming a mold frame, a discharge plate, and a bottom chassis, and thus the display device 10 may be slimmed down.

Hereinafter, a method of manufacturing the display device will be described in detail with reference to FIG. 6.

Figure 6:
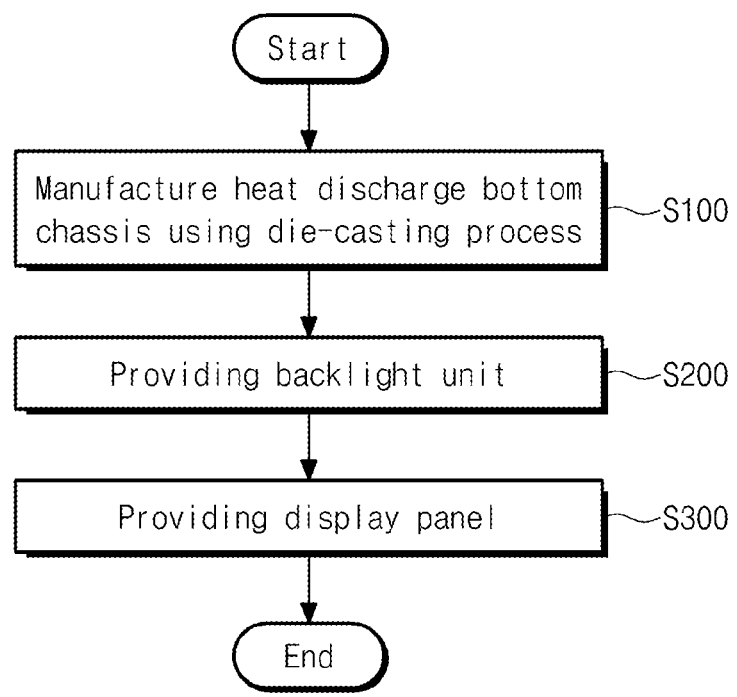
FIG. 6 is a flowchart showing a method of manufacturing a display device according to an exemplary embodiment of the present disclosure.

FIG. 6 is a flowchart showing a method of manufacturing a display device according to an exemplary embodiment of the present disclosure.

Referring to FIGS. 1A to 6, the manufacturing method of the display device 10 includes manufacturing the heat discharge bottom chassis 300 using the die-casting method (S100), providing the backlight unit 200 to the heat discharge bottom chassis 300 (S200), and providing the display panel 100 on the backlight unit 200 (S300). Each of the display panel 100, the backlight unit 200, and the heat discharge bottom chassis 300 have the curved shape.

The heat discharge bottom chassis 300 includes the light source unit accommodating part 310 accommodating the light source unit 230, the optical member accommodating part 320 disposed on the light source unit accommodating part 310, accommodating the optical member 250, and supporting the display panel 100, and the display panel accommodating part 330 disposed on the optical member accommodating part 320 and accommodating the display panel 100.

The light source unit accommodating part 310, the optical member accommodating part 320, and the display panel accommodating part 330 may be manufactured through a single process. For instance, the light source unit accommodating part 310, the optical member accommodating part 320, and the display panel accommodating part 330 may be manufactured by the die-casting method.

The heat discharge bottom chassis 300 is manufactured using the metal material or the metal alloy. For instance, the heat discharge bottom chassis 300 is manufactured using aluminum, gold, silver, iron, etc.

The light source unit accommodating part 310 accommodates the light source unit 230. The light source unit accommodating part 310 is connected with the optical member accommodating part 320. The light source unit accommodating part 310 is provided with the light source unit accommodating groove G1 formed therein to accommodate the light source unit 230.

The optical member accommodating part 320 is disposed on the light source unit accommodating part 310. The optical member accommodating part 320 is disposed between the light source unit accommodating part 310 and the display panel accommodating part 330. The optical member accommodating part 320 is connected with the light source unit accommodating part 310. The optical member accommodating part 320 is connected with the display panel accommodating part 330. The optical member accommodating part 320 accommodates the optical member 250 therein and supports the display panel 100. The optical member accommodating part 320 is provided with the optical member accommodating hole H1 formed therethrough to accommodate the optical member 250. The optical member accommodating part 320 accommodates the light guide plate 240.

The display panel accommodating part 330 is disposed on the optical member accommodating part 320 and accommodates the display panel 100. The display panel accommodating part 330 is connected to the optical member accommodating part 320. The display panel accommodating part 330 is provided with the display panel accommodating hole H2 formed therethrough to accommodate the display panel 100. The display panel accommodating hole H2 is greater than the optical member accommodating hole H1.

The providing (S200) of the backlight unit 200 includes providing the light source unit 230 and providing the optical member 250 disposed on the light source unit 230. The providing (S200) of the backlight unit 200 may further include providing the light guide plate.

The light source unit 230 is provided to the light source unit accommodating part 310. The light source unit 230 is accommodated in the light source unit accommodating groove G1. The optical member 250 is provided to the optical member accommodating part 320. The optical member 250 is provided in the optical member accommodating hole H1. The light guide plate is disposed on the optical member 250 and provided in the optical member accommodating part 320. The light guide plate is provided in the optical member accommodating hole H1

In the providing of the display panel 100 (S300), the display panel 100 is disposed on the backlight unit 200. The display panel 100 is provided to the display panel accommodating part 330. The display panel 100 is provided in the display panel accommodating hole H2. The display panel 100 is supported by the optical member accommodating part 320.

The manufacturing method of the display device 10 may further include providing the printed circuit board 410 electrically connected to the display panel and the tape carrier package 420 connected to the printed circuit board 410 and the display panel.

The printed circuit board 410 is electrically connected to the display panel 100. The printed circuit board 410 is attached to the lower portion of the heat discharge bottom chassis 300. The printed circuit board 410 has the curved shape.

The tape carrier package 420 electrically connects the printed circuit board 410 and the display panel 100. The tape carrier package 420 is formed to have the film shape with elasticity. The tape carrier package 420 is provided in a plural number.

The manufacturing method of the display device 10 according to the present exemplary embodiment may further include providing the top chassis 500. The top chassis 500 covers at least one side surface of the side surfaces of the display panel 100.

The top chassis 500 covers the printed circuit board 410 and the tape carrier package 420. The top chassis 500 has the curved shape. The top chassis 500 is provided on at least one side surface of the heat discharge bottom chassis 300. For instance, the top chassis 500 is provided on the one side surface of the heat discharge bottom chassis 300 without being disposed on other side surfaces.

The top chassis 500 includes the same material as that of the heat discharge bottom chassis 300. For instance, the top chassis 500 includes the metal material or the metal alloy. For instance, the top chassis 500 includes aluminum, gold, silver, iron, etc.

The conventional display device manufactured by a conventional manufacturing method of the conventional display device includes the set structure coupled to the outer surface of the display device, and thus it is difficult to slim the display device. However, the display device 10 manufactured by the manufacturing method according to the present exemplary embodiment includes the heat discharge bottom chassis 300 obtained by integrally forming the mold frame, the discharge plate, and the bottom chassis, and thus the display device 10 may be slimmed down. In addition, since the heat discharge bottom chassis 300 obtained by integrally forming the mold frame, the discharge plate, and the bottom chassis is manufactured through the signal process, a manufacturing process of the display device 10 may be simplified.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display device comprising:
   a curved backlight unit configured to generate light;
   a curved display panel disposed on the backlight unit to receive the light to display an image; and
   a curved heat discharge bottom chassis fixing the curved backlight unit and the curved display panel to each other such that at least a portion of each of the backlight unit and the display panel is disposed in a cavity of the curved heat discharge bottom chassis,
   wherein the curved backlight unit comprises:
      a light source unit configured to generate the light; and
      an optical member disposed on the light source unit,
   wherein the curved heat discharge bottom chassis comprises:
      a light source unit accommodating part forming a bottom surface of the cavity that faces the curved display panel, the light source unit accommodating part accommodating the light source unit;
      an optical member accommodating part integrally protruding from the bottom surface of the light source unit accommodating part to form first accommodating sidewalls of a first portion of the cavity, the optical member accommodating part accommodating the optical member and supporting the display panel; and
      a display panel accommodating part integrally protruding from the first accommodating sidewalls of the optical member accommodating part to form second accommodating sidewalls of a second portion of the cavity, the display panel accommodating part accommodating the display panel,
   wherein the light source unit accommodating part, the optical member accommodating part, and the display panel accommodating part form a single unitary structure.

2. The display device of claim 1, wherein the light source unit accommodating part, the optical member accommodating part, and the display panel accommodating part comprise a same material.

3. The display device of claim 1, wherein the light source unit accommodating part, the optical member accommodating part, and the display panel accommodating part exhibit properties of parts formed through a same process.

4. The display device of claim 3, wherein the light source unit accommodating part, the optical member accommodating part, and the display panel accommodating part exhibit properties of a die-cast structure.

5. The display device of claim 1, wherein the light source unit accommodating part, the optical member accommodating part, and the display panel accommodating part comprise a metal material or a metal alloy.

6. The display device of claim 1, wherein:
   the display panel accommodating part comprises a display panel accommodating hole to accommodate the curved display panel, the display panel accommodating hole forming second portion of the cavity;
   the optical member accommodating part comprises an optical member accommodating hole to accommodate the optical member, the optical member accommodating hole forming the first portion of the cavity in communication with the second portion of the cavity; and
   the light source unit accommodating part comprises a light source unit accommodating groove in the bottom surface to accommodate the light source unit, the groove being in communication with the first portion of the cavity.

7. The display device of claim 6, wherein the optical member accommodating hole has a size smaller than a size of the display panel accommodating hole.

8. The display device of claim 1, wherein a width of at least one of the first accommodating sidewalls is greater than a width of at least one of the second accommodating sidewalls.

9. The display device of claim 8, wherein at least one of the first accommodating sidewalls supports the display panel.

10. The display device of claim 1, wherein:
the first accommodating sidewalls comprise:
  a first sub-accommodating sidewall;
  a second sub-accommodating sidewall spaced apart from the first sub-accommodating sidewall;
  a third sub-accommodating sidewall connected to the first and second sub-accommodating sidewalls; and
  a fourth sub-accommodating sidewall spaced apart from the third sub-accommodating sidewall,
the second accommodating sidewalls comprise:
  a fifth sub-accommodating sidewall;
  a sixth sub-accommodating sidewall spaced apart from the fifth sub-accommodating sidewall;
  a seventh sub-accommodating sidewall connected to the fifth and sixth sub-accommodating sidewalls; and
  an eighth sub-accommodating sidewall spaced apart from the seventh sub-accommodating sidewall; and
a distance between the fifth sub-accommodating sidewall and the sixth sub-accommodating sidewall is greater than a distance between the first sub-accommodating sidewall and the second sub-accommodating sidewall.

11. The display device of claim 1, further comprising:
a printed circuit board electrically connected to the display panel; and
a tape carrier package connected to the display panel and the printed circuit board.

12. The display device of claim 11, further comprising a top chassis covering at least one side surface of side surfaces of the display panel.

13. The display device of claim 12, wherein:
the printed circuit board is disposed under the curved heat discharge bottom chassis; and
the top chassis covers the printed circuit board and the tape carrier package.

14. The display device of claim 1, wherein:
the curved heat discharge bottom chassis further comprises a bracket to reinforce a strength of the curved heat discharge bottom chassis; and
the bracket, the light source unit accommodating part, the optical member accommodating part, and the display panel accommodating part are integrally formed with one another.

15. The display device of claim 1, wherein:
the curved display panel has a first radius of curvature;
the curved backlight unit has a second radius of curvature greater than the first radius of curvature; and
the curved heat discharge bottom chassis has a third radius of curvature greater than the first radius of curvature and the second radius of curvature.

* * * * *